United States Patent
Bellorado et al.

(10) Patent No.: US 11,018,842 B1
(45) Date of Patent: May 25, 2021

(54) DYNAMIC TIMING RECOVERY BANDWIDTH MODULATION FOR PHASE OFFSET MITIGATION

(71) Applicant: Seagate Technology LLC, Cupertino, CA (US)

(72) Inventors: Jason Bellorado, San Jose, CA (US); Marcus Marrow, San Jose, CA (US); Zheng Wu, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 16/051,252

(22) Filed: Jul. 31, 2018

(51) Int. Cl.
*H04L 7/00* (2006.01)
*H03L 7/08* (2006.01)

(52) U.S. Cl.
CPC .......... *H04L 7/0033* (2013.01); *H03L 7/0807* (2013.01); *H04L 7/0079* (2013.01)

(58) Field of Classification Search
CPC ......... H03L 7/06; H03L 7/0807; H03L 7/081; H03L 7/0814; H03L 7/091; H03L 7/093; H03L 7/0994; H03L 7/0998; H04L 7/0016; H04L 7/002; H04L 7/0025; H04L 7/0033; H04L 7/0041; H04L 7/0062; H04L 7/0079
USPC ....... 375/226, 323, 324, 326, 327, 340, 373, 375/375, 376; 327/147, 156, 160; 329/307, 309, 310; 713/400, 503
See application file for complete search history.

(56) References Cited

U.S. PATENT DOCUMENTS

| | | | |
|---|---|---|---|
| 5,255,289 A | * | 10/1993 | Tomita ................. H04L 7/0334 375/332 |
| 5,321,564 A | | 6/1994 | Takahashi |
| 5,461,644 A | | 10/1995 | Bermans et al. |
| 5,543,978 A | | 8/1996 | Park |
| 5,621,769 A | | 4/1997 | Wan et al. |
| 5,654,765 A | | 8/1997 | Kim |
| 5,742,532 A | | 4/1998 | Duyne et al. |
| 5,862,192 A | | 1/1999 | Huszar et al. |
| 5,970,093 A | | 10/1999 | Lantremange |
| 6,111,712 A | | 8/2000 | Vishakhadatta et al. |
| 6,157,510 A | | 12/2000 | Schreck et al. |

(Continued)

OTHER PUBLICATIONS

Guo, Yuanbin, "An Efficient Circulant MIMO Equalizer for CDMA Downlink: Algorithm and VLSI Architecture", Hindawi Publishing Corporation, 2006, pp. 1-18.

(Continued)

*Primary Examiner* — Young T. Tse
(74) *Attorney, Agent, or Firm* — Kirk A. Cesari (57) ABSTRACT

An apparatus may include a sampling circuit configured to produce a sequence of input samples based on a continuous time input signal and a sample clock signal, the sampling phase of the sequence of input samples based on a phase control value output by a timing recovery circuit. In addition, the apparatus may include the timing recovery circuit configured to receive the sequence of input samples, detect, for a current sample of the sequence of input samples, a phase offset in the sampling phase of the sequence of input samples, the phase offset being a deviation of the sampling phase from an expected phase, and in response to detecting the phase offset, select a bandwidth for timing recovery. Further, the timing recovery circuit may generate an updated phase control value based on the selected bandwidth for timing recovery.

16 Claims, 7 Drawing Sheets

(56) References Cited

U.S. PATENT DOCUMENTS

| | | | |
|---|---|---|---|
| 6,181,213 B1 | 1/2001 | Chang | |
| 6,222,592 B1 | 4/2001 | Patel | |
| 6,320,920 B1 | 11/2001 | Beyke | |
| 6,377,552 B1 | 4/2002 | Moran et al. | |
| 6,396,887 B1 | 5/2002 | Ware et al. | |
| 6,438,185 B1 | 8/2002 | Huttunen | |
| 6,505,222 B1 | 1/2003 | Davis et al. | |
| 6,519,107 B1 | 2/2003 | Ehrlich et al. | |
| 6,549,587 B1* | 4/2003 | Li | H04B 3/23 375/324 |
| 6,580,676 B1 | 6/2003 | Yanagisawa et al. | |
| 6,581,182 B1 | 6/2003 | Lee | |
| 6,633,894 B1 | 10/2003 | Cole | |
| 6,665,308 B1 | 12/2003 | Rakib et al. | |
| 6,687,073 B1 | 2/2004 | Kupferman | |
| 6,697,891 B2 | 2/2004 | Emberty et al. | |
| 6,707,772 B1 | 3/2004 | Marrec et al. | |
| 6,738,205 B1 | 5/2004 | Moran et al. | |
| 6,738,215 B2 | 5/2004 | Yatsu | |
| 6,950,258 B2 | 9/2005 | Takaishi | |
| 6,993,291 B2 | 1/2006 | Parssinen et al. | |
| 7,042,972 B2* | 5/2006 | Fahim | H03D 13/004 327/156 |
| 7,046,701 B2 | 5/2006 | Mohseni et al. | |
| 7,085,330 B1* | 8/2006 | Shirali | H03F 1/3247 375/296 |
| 7,133,233 B1 | 11/2006 | Ray et al. | |
| 7,133,239 B1 | 11/2006 | Hartman et al. | |
| 7,245,448 B2 | 7/2007 | Urata | |
| 7,298,573 B2 | 11/2007 | Kitamura | |
| 7,324,437 B1 | 1/2008 | Czylwik et al. | |
| 7,362,432 B2 | 4/2008 | Roth | |
| 7,440,208 B1 | 10/2008 | McEwen et al. | |
| 7,929,238 B1 | 4/2011 | Vasquez | |
| 7,940,667 B1 | 5/2011 | Coady et al. | |
| 7,948,703 B1 | 5/2011 | Yang | |
| 8,027,117 B1 | 9/2011 | Sutardja et al. | |
| 8,139,301 B1 | 3/2012 | Li et al. | |
| 8,160,181 B1 | 4/2012 | Song et al. | |
| 8,172,755 B2 | 5/2012 | Song et al. | |
| 8,296,637 B1 | 10/2012 | Varnica et al. | |
| 8,400,726 B1 | 3/2013 | Wu et al. | |
| 8,456,977 B2 | 6/2013 | Honma | |
| 8,479,086 B2 | 7/2013 | Xia et al. | |
| 8,514,506 B1 | 8/2013 | Li et al. | |
| 8,539,328 B2 | 9/2013 | Jin et al. | |
| 8,542,766 B2 | 9/2013 | Chekhovstov et al. | |
| 8,543,894 B1 | 9/2013 | Varnica et al. | |
| 8,713,413 B1 | 4/2014 | Bellorado et al. | |
| 8,724,245 B1 | 5/2014 | Smith et al. | |
| 8,755,139 B1 | 6/2014 | Zou et al. | |
| 8,760,794 B1 | 6/2014 | Coker et al. | |
| 8,767,341 B1 | 7/2014 | Coker et al. | |
| 8,780,477 B1 | 7/2014 | Guo et al. | |
| 8,837,068 B1 | 9/2014 | Liao et al. | |
| 8,861,111 B1 | 10/2014 | Liao et al. | |
| 8,861,112 B1 | 10/2014 | Pan et al. | |
| 8,887,033 B1 | 11/2014 | Varnica et al. | |
| 8,953,276 B1 | 2/2015 | Pokharel et al. | |
| 9,007,707 B1 | 4/2015 | Lu et al. | |
| 9,019,642 B1 | 4/2015 | Xia et al. | |
| 9,025,269 B1 | 5/2015 | Wong et al. | |
| 9,064,537 B1 | 6/2015 | Nie et al. | |
| 9,082,418 B2 | 7/2015 | Ong et al. | |
| 9,093,115 B1 | 7/2015 | Fung et al. | |
| 9,099,132 B1 | 8/2015 | Grundvig et al. | |
| 9,129,650 B2 | 9/2015 | Mathew et al. | |
| 9,147,416 B2 | 9/2015 | Grundvig et al. | |
| 9,189,315 B1 | 11/2015 | Varnica et al. | |
| 9,196,298 B1 | 11/2015 | Zhang et al. | |
| 9,245,578 B1 | 1/2016 | Wang et al. | |
| 9,245,579 B2 | 1/2016 | Song et al. | |
| 9,245,580 B1 | 1/2016 | Lu et al. | |
| 9,246,668 B1 | 1/2016 | Yu et al. | |
| 9,257,135 B2 | 2/2016 | Ong et al. | |
| 9,257,145 B1 | 2/2016 | Soderbloom et al. | |
| 9,286,915 B1 | 3/2016 | Dziak et al. | |
| 9,311,937 B2 | 4/2016 | Zou et al. | |
| 9,311,959 B1 | 4/2016 | Fan et al. | |
| 9,385,757 B1 | 7/2016 | Nangare | |
| 9,401,161 B1 | 7/2016 | Jury et al. | |
| 9,424,878 B1 | 8/2016 | Dziak et al. | |
| 9,431,052 B2 | 8/2016 | Oberg et al. | |
| 9,489,976 B2 | 11/2016 | Jury et al. | |
| 9,508,369 B2 | 11/2016 | Chu et al. | |
| 9,536,563 B1 | 1/2017 | Liu et al. | |
| 9,542,972 B1 | 1/2017 | Nayak et al. | |
| 9,564,157 B1 | 2/2017 | Trantham | |
| 9,590,803 B2 | 3/2017 | Derras et al. | |
| 9,645,763 B2 | 5/2017 | Sankaranarayanan et al. | |
| 9,672,850 B2 | 6/2017 | Grundvig et al. | |
| 9,728,221 B2 | 8/2017 | Oberg et al. | |
| 9,819,456 B1 | 11/2017 | Bellorado et al. | |
| 9,947,362 B1 | 4/2018 | Venkataramani et al. | |
| 9,998,136 B1 | 6/2018 | Wu | |
| 10,014,026 B1 | 7/2018 | Wu et al. | |
| 10,164,760 B1 | 12/2018 | Bellorado et al. | |
| 10,177,771 B1 | 1/2019 | Bellorado et al. | |
| 10,180,868 B2 | 1/2019 | Alhussien et al. | |
| 10,276,233 B1 | 4/2019 | Danjean et al. | |
| 10,297,281 B1 | 5/2019 | Bellorado et al. | |
| 10,469,290 B1 | 11/2019 | Marrow et al. | |
| 10,498,565 B1* | 12/2019 | Azenkot | H04L 25/03019 |
| 2002/0080898 A1 | 6/2002 | Agazzi et al. | |
| 2002/0181439 A1 | 12/2002 | Orihashi et al. | |
| 2003/0185114 A1 | 10/2003 | Liaw | |
| 2003/0198152 A1 | 10/2003 | Morishima | |
| 2003/0198165 A1 | 10/2003 | Mouri et al. | |
| 2004/0004962 A1* | 1/2004 | Glazko | H04B 1/7075 370/375 |
| 2004/0101068 A1* | 5/2004 | Wang | H04B 1/7093 375/324 |
| 2004/0228397 A1 | 11/2004 | Bach | |
| 2005/0117243 A1 | 6/2005 | Serizawa | |
| 2005/0169415 A1* | 8/2005 | Nayak | H04L 7/0054 375/355 |
| 2005/0270687 A1 | 12/2005 | Zweighaft | |
| 2006/0215290 A1 | 9/2006 | Kurtas et al. | |
| 2007/0139805 A1 | 6/2007 | Mead | |
| 2007/0139806 A1 | 6/2007 | Southerland et al. | |
| 2007/0177292 A1 | 8/2007 | Bui et al. | |
| 2008/0007855 A1 | 1/2008 | Vityaev et al. | |
| 2008/0158711 A1 | 7/2008 | Bliss et al. | |
| 2008/0175309 A1 | 7/2008 | Fimoff et al. | |
| 2009/0028252 A1* | 1/2009 | Lu | H04L 27/2656 375/260 |
| 2009/0097606 A1 | 4/2009 | Hutchins et al. | |
| 2009/0141386 A1 | 6/2009 | Miura | |
| 2009/0262870 A1 | 10/2009 | Ashbrook et al. | |
| 2009/0323214 A1 | 12/2009 | Grundvig et al. | |
| 2010/0290153 A1 | 11/2010 | Hampshire | |
| 2011/0002375 A1 | 1/2011 | Honma | |
| 2011/0072335 A1 | 3/2011 | Liu et al. | |
| 2011/0090773 A1 | 4/2011 | Yu et al. | |
| 2011/0176400 A1 | 7/2011 | Gerasimov | |
| 2012/0082018 A1 | 4/2012 | Gushima et al. | |
| 2012/0105994 A1 | 5/2012 | Bellorado et al. | |
| 2012/0155577 A1 | 6/2012 | Shukla et al. | |
| 2013/0076433 A1 | 3/2013 | Fratti | |
| 2013/0201838 A1 | 8/2013 | Homchaudhuri et al. | |
| 2014/0009192 A1 | 1/2014 | Suzuki | |
| 2014/0035638 A1 | 2/2014 | Bode | |
| 2014/0223114 A1 | 8/2014 | Wang et al. | |
| 2015/0003221 A1 | 1/2015 | Sankaranarayanan et al. | |
| 2015/0022916 A1 | 1/2015 | Zou et al. | |
| 2015/0279398 A1 | 10/2015 | Fan et al. | |
| 2015/0355838 A1 | 12/2015 | Chen et al. | |
| 2015/0380048 A1 | 12/2015 | Oberg et al. | |
| 2016/0019921 A1 | 1/2016 | Bui et al. | |
| 2016/0112218 A1 | 4/2016 | Abe | |
| 2016/0293205 A1 | 10/2016 | Jury et al. | |
| 2016/0351227 A1 | 12/2016 | Koshino | |
| 2017/0125089 A1 | 5/2017 | Sankaranarayanan et al. | |
| 2017/0125110 A1 | 5/2017 | Sankaranarayanan et al. | |

(56) References Cited

U.S. PATENT DOCUMENTS

| | | |
|---|---|---|
| 2017/0236592 A1 | 8/2017 | Alhussien et al. |
| 2017/0249206 A1 | 8/2017 | Jeong et al. |
| 2018/0011753 A1 | 1/2018 | Alhussien et al. |
| 2018/0012663 A1 | 1/2018 | Alhussien et al. |
| 2018/0277158 A1 | 9/2018 | Kishino |
| 2018/0367164 A1 | 12/2018 | Marrow et al. |
| 2019/0130967 A1 | 5/2019 | Danjean et al. |
| 2020/0065262 A1 | 2/2020 | Bellorado |

OTHER PUBLICATIONS

Hicks, James, "Overloaded Array Processing with Spatially Reduced Search Joint Detection", Virginia Polytechnic Institute & State University, May 10, 2000, pp. 1-144.

Mohammad, Maruf, "Blind Acquisition of Short Burst with Per-Survivor Processing (PSP)", Virginia Polytechnic Institute & State University, Nov. 26, 2002, pp. 1-127.

Nechaev, Y. B., et al., "Increasing Efficiency of Information Transmission with Interference Influence by the Use of Multi-Parameter Adaptation", East-West Design & Test Symposium (EWDTS 2013), Rostov-on-Don, 2013, pp. 1-4 (Year: 2013).

\* cited by examiner

DYNAMIC TIMING RECOVERY BANDWIDTH MODULATION FOR PHASE OFFSET MITIGATION

SUMMARY

In certain embodiments, an apparatus may include a sampling circuit configured to produce a sequence of input samples based on a continuous time input signal and a sample clock signal, the sampling phase of the sequence of input samples based on a phase control value output by a timing recovery circuit. In addition, the apparatus may include the timing recovery circuit configured to receive the sequence of input samples, detect, for a current sample of the sequence of input samples, a phase offset in the sampling phase of the sequence of input samples, the phase offset being a deviation of the sampling phase from an expected phase, and in response to detecting the phase offset, select a bandwidth for timing recovery. Further, the timing recovery circuit may generate an updated phase control value based on the selected bandwidth for timing recovery.

In certain embodiments, a system may include a timing recovery circuit including an input configured to receive a sequence of input samples, the sampling phase of the sequence of input samples based on a phase control value output by the timing recovery circuit. The system may also include a phase offset detector circuit configured to detect, for a current sample of the sequence of input samples, a phase offset in the sampling phase of the sequence of input samples, the phase offset being a deviation of the sampling phase from an expected phase, and in response to detecting the phase offset, select a bandwidth for timing recovery. Further, the system may include a loop filter configured to generate an update value for the phase control value based on the selected bandwidth for timing recovery and an update circuit configured to generate an updated phase control value based on the phase control value and the update value.

In certain embodiments, a method may include producing, by a sampling circuit, a sequence of input samples based on a continuous time input signal and a sample clock signal, the sampling phase of the sequence of input samples based on a phase control value output by a timing recovery circuit, receiving, by an input of the timing recovery circuit, the sequence of input samples, and detecting, by a phase offset detector circuit of the timing recovery circuit, for a current sample of the sequence of input samples, a phase offset in the sampling phase of the sequence of input samples, the phase offset being a deviation of the sampling phase from an expected phase. In response to detecting the phase offset, the method may further include selecting, by the phase offset detector circuit, a bandwidth for timing recovery, generating, by a loop filter of the timing recovery circuit, an update value for the phase control value based on the selected bandwidth for timing recovery, and generating, by an update circuit of the timing recovery circuit, an updated phase control value based on the phase control value and the update value.

DETAILED DESCRIPTION

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to timing recovery systems, and in some embodiments, the present disclosure may relate to decision directed timing recovery systems that may detect a phase offset and determine a bandwidth for the timing recovery based on the phase offset.

Some systems, such as electrical, electronic, motor drive, processing, or other systems may receive a signal of interest and process that signal. For example, a read channel of a communication system or a magnetic recording storage system may receive analog input signals of underlying data at a sensor (e.g. a read head sensing a track of a magnetic storage medium). The read channel may then sample the input signals to generate a sequence of digitized samples.

In some systems, sampling of the digitized signals may be sampled at or aligned to a given sampling phase before being applied to a digital receiver (e.g. a decision directed timing recovery circuit). For example, the digital receiver may be a detector, a decoder, a filter or other digital system. In some digital receivers, the digitized samples may be processed by the digital receiver to reconstruct the underlying data. In some such systems, the digital receiver may provide a phase control signal as feedback that may be used for aligning the sampling phase of the digitized samples to an expected sampling phase. In some embodiments, the expected phase may be the phase of underlying data written to and being read from a magnetic storage medium. The timing recovery circuit of the digital receiver may operate to update to phase control signal such that the sampling phase more closely matches the expected phase. The phase control value may then be used to adjust of the sampling phase of the digitized samples to the expected sampling phase by phase interpolating a clock signal of an analog to digital converter (ADC) generating the samples from a continuous time signal or by digitally interpolating samples generated using an unchanged clock and so on.

Timing recovery may also remove or reduce negative effects from various problems. For example, timing recovery may also allow for recovery from phase offsets caused by mode hops. Mode hops may occur in magnetic storage devices that utilize Heat Assisted Magnetic Recording (HAMR).

In some HAMR systems, high recording densities may be achievable through use of media comprised of magnetic grains with exceedingly small dimension in the plane of surface of the disk. For the purpose of thermally stability, the magnetic grains may also have a larger dimension in the plane perpendicular to the surface of the disk. This attribute may lead to high media coercivity (e.g. resistance to change in magnetic polarity due to an applied magnetic field). Although this property may achieve the desired stability, this property may also make recording data to such media difficult as strong magnetic fields may be needed to overcome its large resistance to polarity inversion.

To obviate the difficulties encountered in writing to this media, a laser may be affixed to the write-head to assist the write process by heating the media just before the magnetic field is applied. This heating may effectively reduce the media coercivity such that a magnetic field with moderate magnitude may be used to influence the polarity of the constituent grains in the heated area of the HAMR media. The use of lasers for this operation, however, may not be without difficulties.

One of the impediments in using semiconductor-based lasers for assisting the HAMR write operation may be their propensity to mode hop. In some HAMR systems, a mode hop may occur due to the dependence of the laser output spectrum on the temperature of the laser. During a write operation, the laser may heat up, which may induce a gradual shift in its output wavelength. At certain temperatures, however, the wavelength may make a discrete jump in magnitude, a phenomenon known as a mode hop. In addition to a wavelength change, the laser's output intensity may also jump in magnitude. This may cause issues in the HAMR write procedure as the laser intensity may dictate the size of the region on the disk that is heated by the laser. As this region may determines the position of written data transitions, an instantaneous jump in its size may act to shift the written transition location, or may induce an instantaneous jump in the phase of the written pattern. Although some such events may be detected during the write operation, some may go undetected and, thus, may have to be handled by the read-operation.

Some embodiments according to this disclosure may allow for timing recovery from phase offsets caused by such mode hops.

However, even in the absence of mode hops, data recovery from a magnetic storage device may include phase offsets that may be addressed by the timing recovery operations disclosed herein. For example, variations may occur in the write-clock relative to the surface of the media due to a number of factors. These may include, but are not limited to, spindle speed variations of the disk rotation, external mechanical vibrations or shock events, and write-clock wandering due to voltage controlled oscillator (VCO) noise and so on. The timing recovery operation may act to recover from these variations to make the read-clock mimic the behavior of the write clock at the time the data was recorded.

The timing recovery techniques and systems disclosed herein may optimize timing recovery for phase offsets with a variety of causes. Generally, the systems and techniques presented herein may act to detect phase offsets (e.g. deviations of the sampling phase from its expected value) and, when appropriate, dynamically adjust the utilized timing recovery bandwidth to improve the probability of successfully timing recovery. Additional discussion of various timing recovery bandwidths with respect to example types of phase offsets that the bandwidths may recover from is provided below following the discussion of FIG. 4.

Timing recovery may be conducted in various system architectures. Two example architectures that provide a basis for further discussion are shown in FIGS. 1 and 2.

Figure 1:
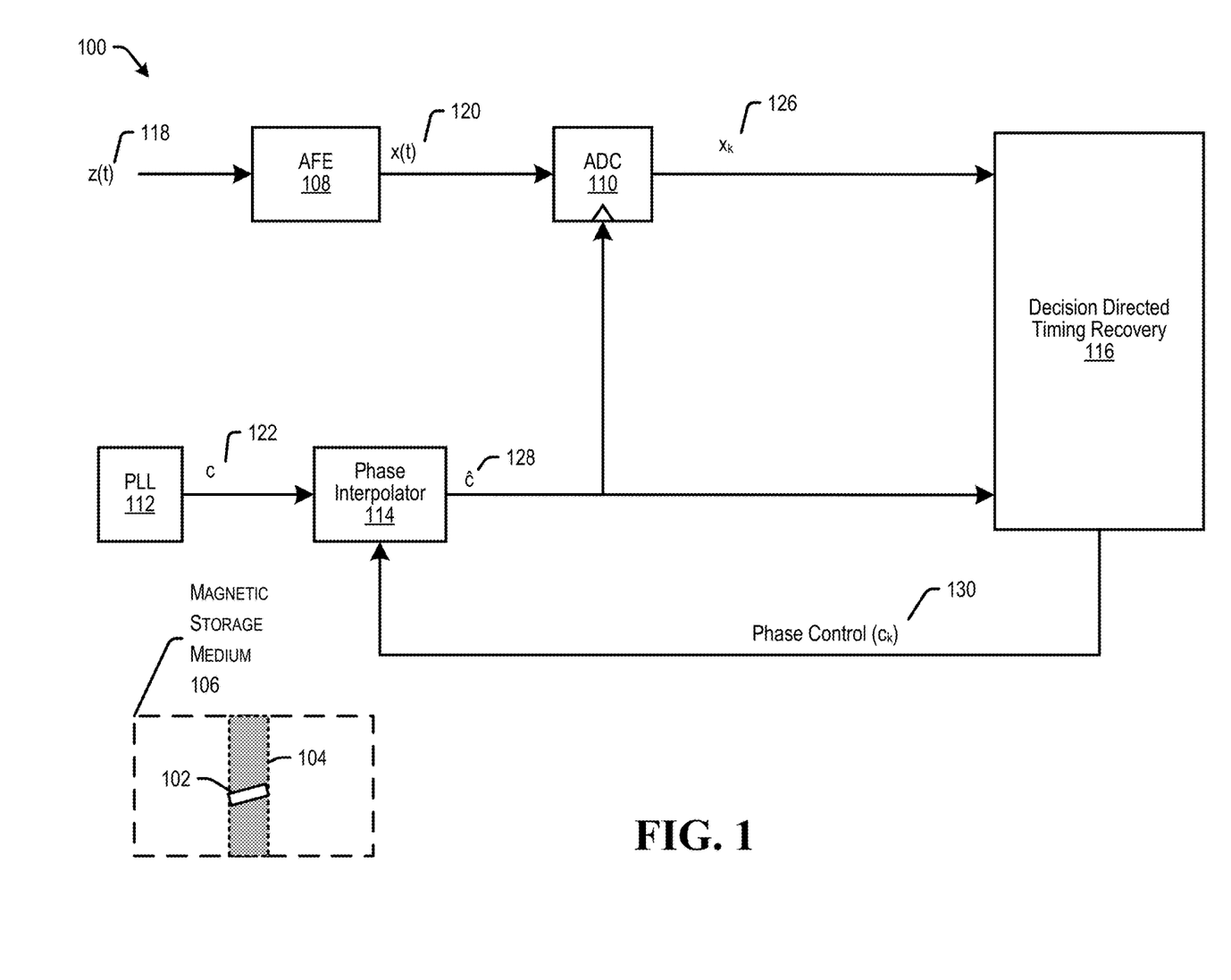
FIG. 1 is a block diagram of a communication channel which may include functionality for timing recovery from phase offsets, in accordance with certain embodiments of the present disclosure.
Figure 2:
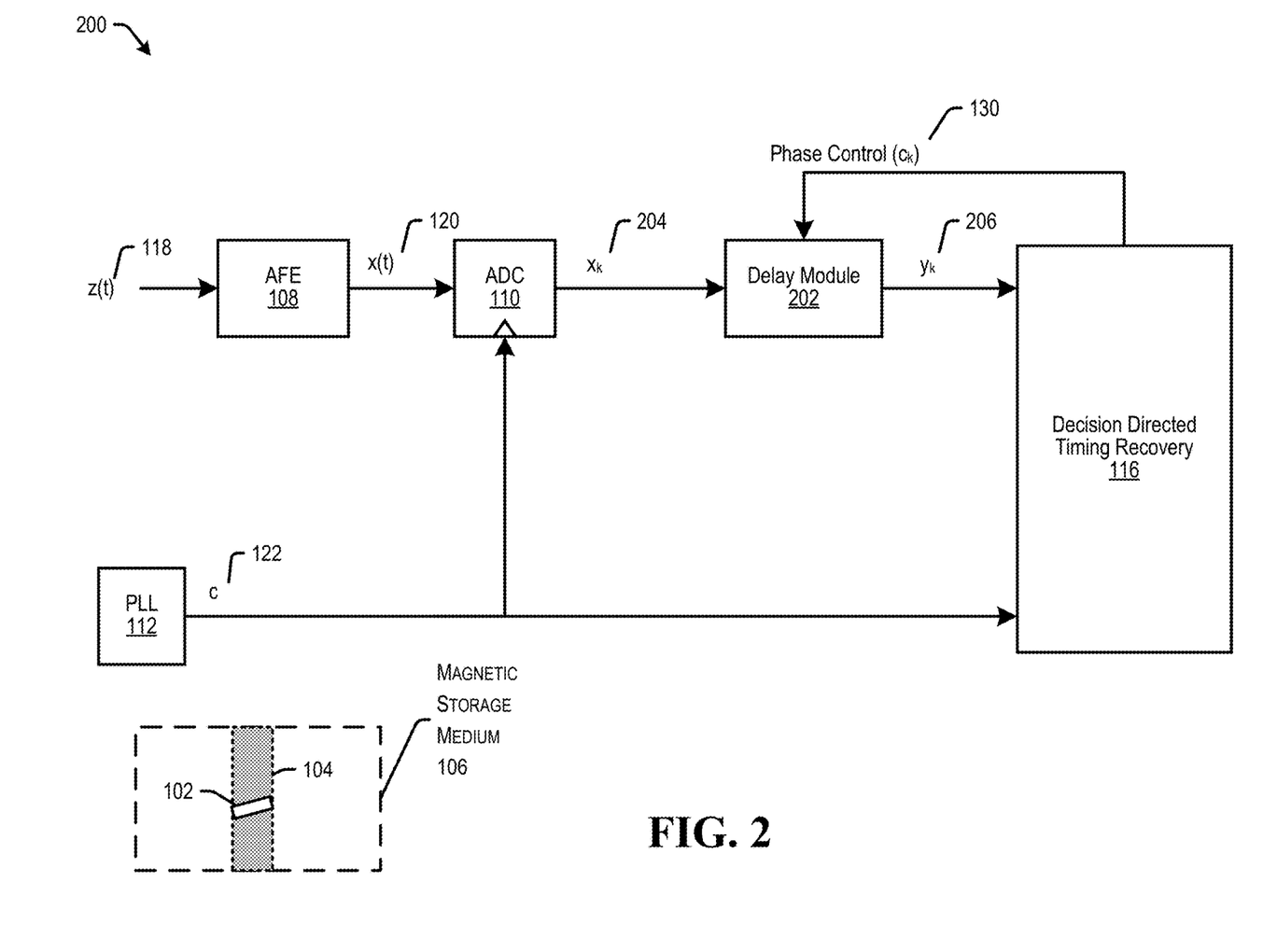
FIG. 2 is a block diagram of a communication channel which may include functionality for timing recovery from phase offsets, in accordance with certain embodiments of the present disclosure.

Referring to FIG. 1, a block diagram of a communication channel which may include functionality for timing recovery from phase offsets is shown and is generally designated 100. More particularly, FIG. 1 may illustrate an example embodiment of a read channel of a magnetic storage system that may include functionality for timing recovery from a phase offset by selecting a bandwidth for timing recovery based on the phase offset. System 100 may include a reader 102 of a read head, which may be reading from a track 104 on a surface of a magnetic storage medium 106. Reader 102 may be coupled to an analog front-end (AFE) 108 (e.g. illustrated as the input to 108) which in turn may be coupled to an analog-to-digital converter (ADC) 110. The system may further include a phase locked loop (PLL) 112 that may be coupled to a phase interpolator 114. The phase interpolator may be coupled to the ADC 110 and a decision directed timing recovery circuit 116 (or a digital receiver including the decision directed timing recovery functionality disclosed herein). The decision directed timing recovery circuit 116 may be coupled to the phase interpolator 114.

Each of the reader 102, the AFE 108, the ADC 110, PLL 112, the phase interpolator 114, and the decision directed timing recovery circuit 116 may be a separate circuit, a system on chip (SOC), firmware, a processor(s), or other system not listed, or any combination thereof. Further, as mentioned above, the decision directed timing recovery circuits discussed throughout this disclosure may be dedicated timing recovery circuits or may be digital receivers including the decision directed timing recovery functionality disclosed herein.

As mentioned above, the reader (or read-sensor) 102 may read from a track 104 on a surface of a magnetic storage medium 106. The reader 102 may produce a continuous time input signal z(t) 118 and may provide the continuous time input signal to the AFE 108. In operation, the AFE 108 may receive the continuous-time signal and perform processing such as analog filtering and applying a gain to produce a continuous time signal x(t) 120.

The PLL 112 may operate to produce a clock signal (c) 122 which may then be provided to the phase interpolator 114. The phase interpolator 114 may receive the clock signal (c) 122 from the PLL 112 and the phase control signal 130 from the decision directed timing recovery circuit 116 and generate a phase shifted clock signal (ĉ) 128 based thereon. In some examples, the phase interpolator 114 may be a circuit that may adjust the phase of an input clock signal (c) 122.

The ADC 110 may receive the phase shifted clock signal (ĉ) 128 and the continuous-time signal x(t) 120. The ADC 110 may sample and quantize the continuous-time signal x(t) 120 at intervals based on the phase shifted clock signal (ĉ) 128 to produce a digitized sequence of samples $x_k$ 126.

The decision directed timing recovery circuit 116 may receive the sample sequence $x_k$ 126 and the phase shifted clock signal (ĉ) 128. Using the phase shifted clock signal (ĉ) 128 to clock its logic, the decision directed timing recovery circuit 116 may process the sample sequence $x_k$ 126. In addition, the decision directed timing recovery circuit 116 may determine or estimate a deviation of the sampling phase of the sample sequence $x_k$ 126 from an expected phase, determine an updated phase control signal 130 and return the updated phase control signal 130 to the phase interpolator 114 as the phase control 130. Additional discussion of the determination of the phase control 130 is set forth below with regard to FIGS. 3-7.

Referring to FIG. 2, a block diagram of a communication channel which may include functionality for timing recovery from phase offsets is shown and is generally designated 200. More particularly, FIG. 2 may illustrate an example embodiment of a read channel of a magnetic storage system that may include functionality for timing recovery from a phase offset by selecting a bandwidth for timing recovery based on the phase offset. System 200 includes similar functionality to that discussed above with regard to FIG. 1 and such similar functionality will not be repeated for sake of brevity. More particularly, system 200 does not include the phase interpolator 114 and instead, includes a delay module 202. The phase locked loop (PLL) 112 of system 200 may be coupled to the ADC 110 and the decision directed timing recovery circuit 116. The decision directed timing recovery circuit 116 may be coupled to the phase interpolator 114. The ADC 110 of system 200 may be coupled to delay module 202 which in turn may be coupled to the decision directed timing recovery circuit 116. The decision directed timing recovery circuit 116 of system 200 may also be coupled to the delay module 202.

The ADC 110 of FIG. 2 may receive the clock signal (c) 122 and the continuous-time signal x(t) 120. The ADC 110 may sample and quantize the continuous-time signal x(t) 120 at intervals based on the clock signal (c) 122 to produce a digitized sequence of samples $x_k$ 204 (e.g. based on the clock signal 122 and not a phase shifted clock signal).

The delay module 202 may receive the digitized sequence of samples $x_k$ 204 and the phase control signal 130 from the decision directed timing recovery circuit 116. The delay module 202 may delay the digitized sequence of samples $x_k$ 204 based on the phase control signal 130. For example, the delay module 202 may include a digital interpolator to perform digital interpolation of the digitized sequence of samples based on phase control signal 130 to generate a phase shifted sample sequence $y_k$ 206.

The decision directed timing recovery circuit 116 of system 200 may receive the phase shifted sample sequences $y_k$ 206 and clock signal (c) 122. Using the clock signal (c) 122 to clock its logic, the decision directed timing recovery circuit 116 may process the phase shifted sample sequences $y_k$ 206. In addition, the decision directed timing recovery circuit 116 may determine or estimate a deviation of the sampling phase of the phase shifted sample sequences $y_k$ 206 from an expected phase, update the phase control signal 130 and return the updated phase control signal 130 to the delay module 202 as the phase control 130.

Figure 3:
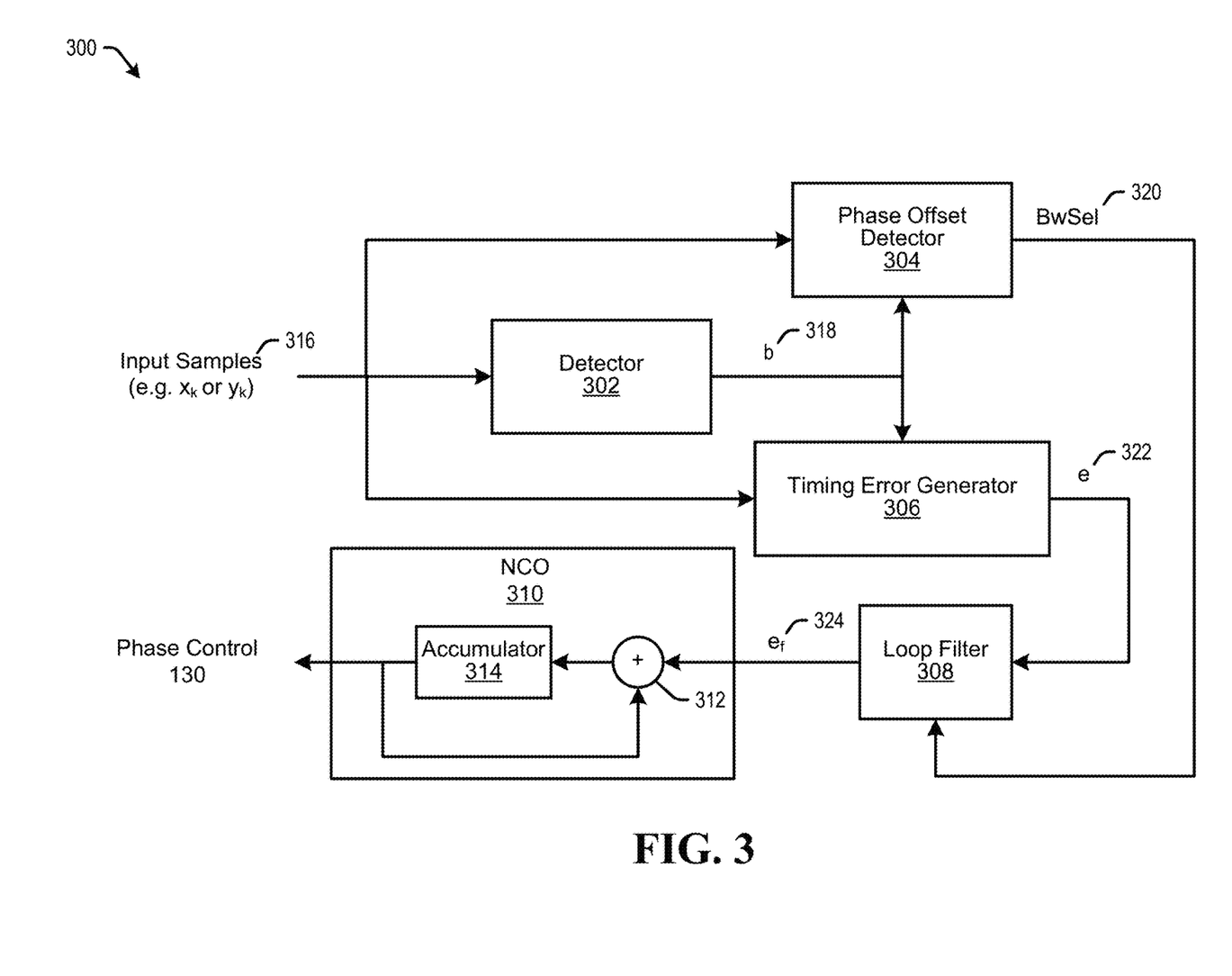
FIG. 3 illustrates a block diagram of an example decision directed timing recovery circuit which may include functionality for timing recovery from and based on phase offsets, in accordance with certain embodiments of the present disclosure.

Referring to FIG. 3, a block diagram of an example decision directed timing recovery circuit which may include functionality for timing recovery from and based on phase offsets is shown and is generally designated 300. More particularly, FIG. 3 may illustrate an example embodiment of a decision directed timing recovery circuit that may include functionality for timing recovery from a phase offset by selecting a bandwidth for timing recovery based on the phase offset. System 300 may include a detector 302, which may be coupled to a sampling circuit (e.g. an ADC or delay circuit) and that may receive input samples (e.g. illustrated as the input to 302). The detector may be further coupled to a phase offset detector 304 and a timing error generator 306. The phase offset detector 304 and timing error generator 306 may each receive the input samples 316 and may be coupled to the loop filter 308. The loop filter 308 may be couple to a numerically controlled oscillator (NCO) 310 which may include an output for the phase control 130. The NCO may further include an adder 312 and an accumulator 314.

Each of the detector 302, phase offset detector 304, the timing error generator 306, loop filter 308, the NCO, the adder 312 and the accumulator 314 may be a separate circuit, a system on chip (SOC), firmware, a processor(s), or other system not listed, or any combination thereof.

In operation, the detector 302 may receive the input samples (e.g. $x_k$ or $y_k$) 316. The detector 302 may then perform detection operations to generate detector decisions b 318 (e.g. estimates of the data pattern underlying the signal used to generate the input samples). The detector 302 may output the detector decisions b 318 to the phase offset detector 304 and the timing error generator 306.

The phase offset detector 304 may operate to monitor the input samples 316 for deviations in sampling phase. In response to detecting a deviation, the phase offset detector 304 may output the BwSel signal 320 which may specify the bandwidth for the timing recovery. For example, the BwSel signal may specify the coefficients of the loop filter or disable second order updates in the loop filter 308. Depending on the embodiment, the BwSel signal 320 may either specify which bandwidth to utilize from a set of previously programmed settings, directly specify the bandwidth setting itself or some combination thereof.

Further, the number of settings may vary. For example, in some embodiments, the BwSel signal 320 may specify one of two settings: one which may be optimized for use in the absence of mode hops (e.g. large deviations in sampling phase) and another optimized to address the presence of a large phase offset. In some other embodiments, the phase offset detector may detect the magnitude of the phase offset and select a BwSel signal value based on the magnitude detected. For example, a first BwSel signal value for a first timing recovery bandwidth setting which may be optimized for normal operation and which may be output in the absence of phase offsets of appreciable magnitude, a second BwSel signal value for a first range of phase offset magnitudes of appreciable size, a third BwSel signal value for a second range of phase offset magnitudes of appreciable size, and so on. Some example BwSel signal values include an optimal timing recovery bandwidth for normal operation, a reduced timing recovery bandwidth, an increased timing recovery bandwidth, a setting that disables second-order loop updates, and so on.

Additional details relating to the specific operation of the phase offset detector 304 and the usage of different BwSel settings are provided below following the discussion of the loop filter architecture illustrated in FIG. 4.

The timing error generator 306 may receive the input samples 316 and the detector decisions b 318. Using the input samples 316 and the detector decisions b 318, the timing error generator 306 may generate a sequence of timing errors (e) 322. The timing error generator 306 may output the sequence of timing errors (e) 322 to the loop filter 308.

The loop filter 308 may operate to reduce the noise of the timing recovery based on the sequence of timing errors (e) 322 using averaging (e.g. using low pass filtering). The bandwidth of the timing recovery may relate to the weight given to new timing errors e 322 by the loop filter. The resulting filtered error ($e_f$) 324 may then be output to the NCO 310. The adder 312 of the NCO 310 may add each new value of the filtered error ($e_f$) 324 to an accumulated value stored in the accumulator 314 to generate an updated value of the phase control 130.

Figure 4:
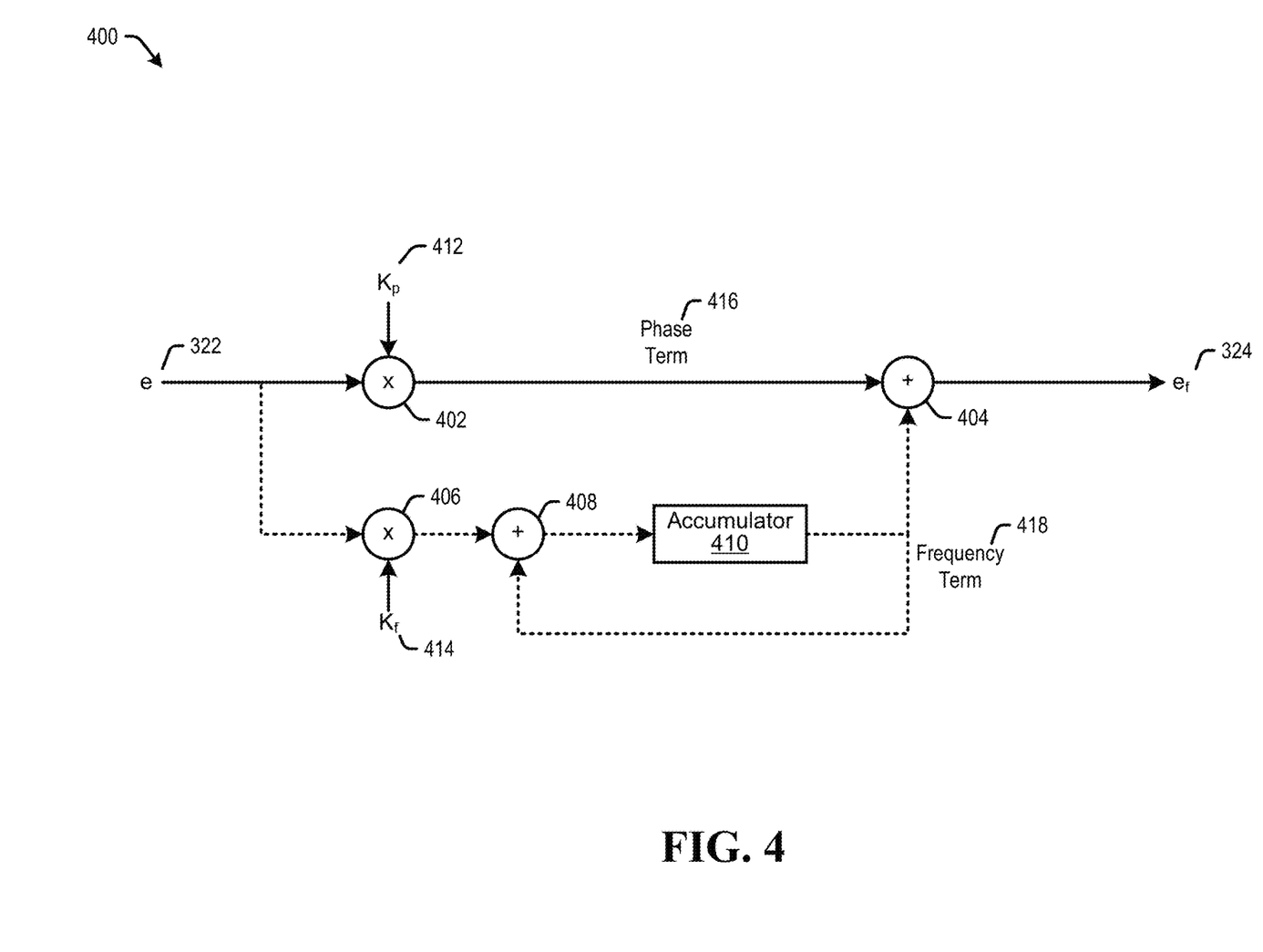
FIG. 4 illustrates a block diagram of an loop filter of a decision directed timing recovery circuit which may include functionality for timing recovery from and based on phase offsets, in accordance with certain embodiments of the present disclosure.

Referring to FIG. 4, a block diagram of an example loop filter of a decision directed timing recovery circuit which may include functionality for timing recovery from and based on phase offsets is shown and is generally designated 400. More particularly, loop filter 400 may be an example embodiment of the loop filter 308. Loop filter 400 may include a multiplier 402 which may be coupled to an adder 404. The loop filter 400 may further include a multiplier 406 coupled to an adder 408. The adder 408 may be coupled to an accumulator 410 which is in turn coupled to the adder 404.

Each of the multiplier 402, adder 404, multiplier 406, adder 408 and the accumulator 410 may be a separate circuit, a system on chip (SOC), firmware, a processor(s), or other system not listed, or any combination thereof.

In operation, the multipliers 402 and 406 may each receive the sequence of timing errors (e) 322. Multiplier 402 may multiply the timing error values by a phase coefficient $K_p$ 412 to generate a phase term 416. Similarly, multiplier 406 may multiply the timing error values by a frequency coefficient $K_f$ 414. The adder 408 may add the result of the multiplication at 406 to a value stored by the accumulator 410 to generate the frequency term 418. The accumulator 410 may then store and output the frequency term 418 to adder 404. The adder 404 may add the phase term 416 and frequency term 418 to generate the filtered error ($e_f$) 324.

The following discussion of potential BwSel settings is based on the loop filter structure in FIG. 4. However, other approaches which provide similar results may be utilized for other loop filter structures.

In a first example BwSel setting, the timing recovery bandwidth may be reduced in response to detecting a phase offset. In some examples, such a reduction would result in each timing error value 322 having a reduced effect on the phase control 130. By providing increased averaging (e.g. by reducing the bandwidth), this BwSel approach decreases the probability of a cycle slip occurring. In some embodiments, reducing the timing recovery bandwidth may provide such reduced probability of cycle slip at the trade off of increasing the time needed to recover from a phase offset (e.g. the smaller weight given to the timing errors will drive the phase control 130 to the correct value slower). Referring to the loop filter structure in FIG. 4, a BwSel setting that reduces the timing recovery bandwidth may apply a reduced phase coefficient $K_p$, a reduced frequency coefficient $K_f$, or some combination thereof to the timing error values 322.

In a second example BwSel setting, the timing recovery bandwidth may be increased in response to detecting a phase offset. In some examples, while this approach may not reduce the probability of cycle slip when a phase discontinuity is encountered, increasing the bandwidth may drive the phase control and, in turn, the sampling phase of the input samples from the phase offset to the correct sampling phase more quickly by increasing the weight given to each timing error 322. For example, in some embodiments, for a mode hop that causes a phase offset of about 40% of a sample period, increasing the timing recovery bandwidth may resolve the phase offset after about 500 units of time while using reduced timing recovery bandwidth may correct the same phase offset after 2500 units of time. However, as mentioned above, the reduced time taken to resolve the phase offset may be balanced by the tradeoff of an increased chance of cycle slip. In some embodiments, cycle slips may be addressed by detecting the location at which the slip occurred and, upon unsuccessful sector recovery, subsequent decoding attempts may be made with the samples spliced together (e.g. inserting or deleting a sample, depending on which adjacent bit was settled to, at the detected phase offset). Even in the event that this splicing is done successfully, the samples between the phase offset and the timing recovery procedure reaching the correct sampling phase may have a residual timing error. As such, reaching the correct sampling phase as quickly as possible, even at the cost of a cycle slip, may be beneficial.

In a third example BwSel setting, the second order loop updates of the loop filter may be disabled. In some embodiments, the timing recovery procedure may be capable of tracking frequency offsets (e.g. differences in the clock frequencies utilized for the write and read operations relative to the rotational velocity of the media). To recover a frequency offset, which may be characterized by a linear change in sampling phase, a second-order timing recovery procedure may be employed. In FIG. 4, the filtered timing error ($e_f$) may be generated as the sum of two terms, where the solid line computes the phase term and the dashed line computes the frequency term. The second order loop updates may be accomplished by the updates of the value stored in accumulator 410 based on the product of the timing error value and the frequency coefficient $K_f$. For example, if a frequency offset is present in a read-back signal, the phase control 130 may be updated by an amount of K units per clock cycle (where K units is the frequency term value 418). In such a case, the filtered error ($e_f$) may settle to an average value of K (e.g. the phase term may have an average value of zero). A first-order timing loop may be unable to track such a frequency offset without error.

However, in some embodiments utilizing a second order timing loop, after the occurrence of a phase offset, the timing error (e) 322 may have a large mean (which may be intensified in proportion to the size of the phase offset). A large mean in the timing error (e) 322 may cause the filtered timing error ($e_f$) 324 to increase in value so as to start the modifying of the phase control signal 130. The increase in the filtered timing error ($e_f$) may, initially, be contributed to primarily or exclusively by the phase term 416. However, over time the contents of the accumulator 410 may also increase which may in turn increase the contribution of the frequency term 418. However, altering the frequency term in such a case may not be desirable as a frequency offset is not being responded to but rather a phase offset. Thus, any change learned by the frequency accumulator may need to be unlearned later. In particular, the undesirable changes in the frequency accumulator may cause the phase control to overshoot the desired sampling phase before returning as the frequency accumulator returns to the settled value already stored prior to the phase offset. Correction of the undesirable changes in the frequency term 418 in the 40% phase offset example discussed above may take about 1000 time units.

In view of this, when a phase offset is observed, the phase offset detector may respond by disabling updates in the second-order section of the loop filter. This may be achieved by setting the frequency coefficient ($K_f$) to zero. While the frequency term 418 may not update while the frequency coefficient ($K_f$) is zero, the contents of the frequency accumulator may remain and be represented in the filtered timing error ($e_f$). Immediately following a phase offset caused by a mode hop, the response of some embodiments with this BwSel setting may be equivalent to the fully updated second-order loop. However, as the timing recovery nears the desired phase, embodiments with this BwSel setting may exhibit a more graceful approach to the desired phase (e.g. without the need to "unlearn" the changes to the frequency term 418). In other words, embodiments with this BwSel setting may not exhibit as pronounced an overshoot of the desired sampling phase.

Finally, while some embodiments may utilize only one of the above BwSel in addition to a BwSel setting used when phase offsets are not present, other embodiments may utilize variations and combinations of the above discussed BwSel settings. As detailed regarding reducing the timing reduction setting above, reducing the bandwidth may increase averaging and, thus, may reduce the probability of cycle slip, especially in the presence of a large phase offset. In some embodiments, the probability of a cycle slip occurring may be zero or near zero for phase offsets of, for example, less than −35% of the sampling period (T). As such, in some embodiments, the magnitude of the detected phase offset may be determined. Then, the timing recovery bandwidth may be reduced if the magnitude of the detected phase offset exceeds 35% of the sampling period. This may minimize the probability of a cycle slip occurring. On the other hand, the bandwidth may be increased for phase offsets of a magnitude in the range, for example, of 15% T and 35% T. This may allow for more rapid convergence for phase offsets when there is negligible probability of cycle slip, thus reducing the time over which residual phase errors are incurred. Further, the second order loop update may be disabled or enabled as desired for any given phase offset magnitude. Finally, some embodiments may begin in one bandwidth and shift to another during the timing recovery. For example, if the phase offset begins at 45% T, the BwSel may be chosen to be reduced bandwidth initially, then, once timing recovery has brought the phase offset below 35% T, the BwSel may be changed to a higher bandwidth setting.

Figure 5:
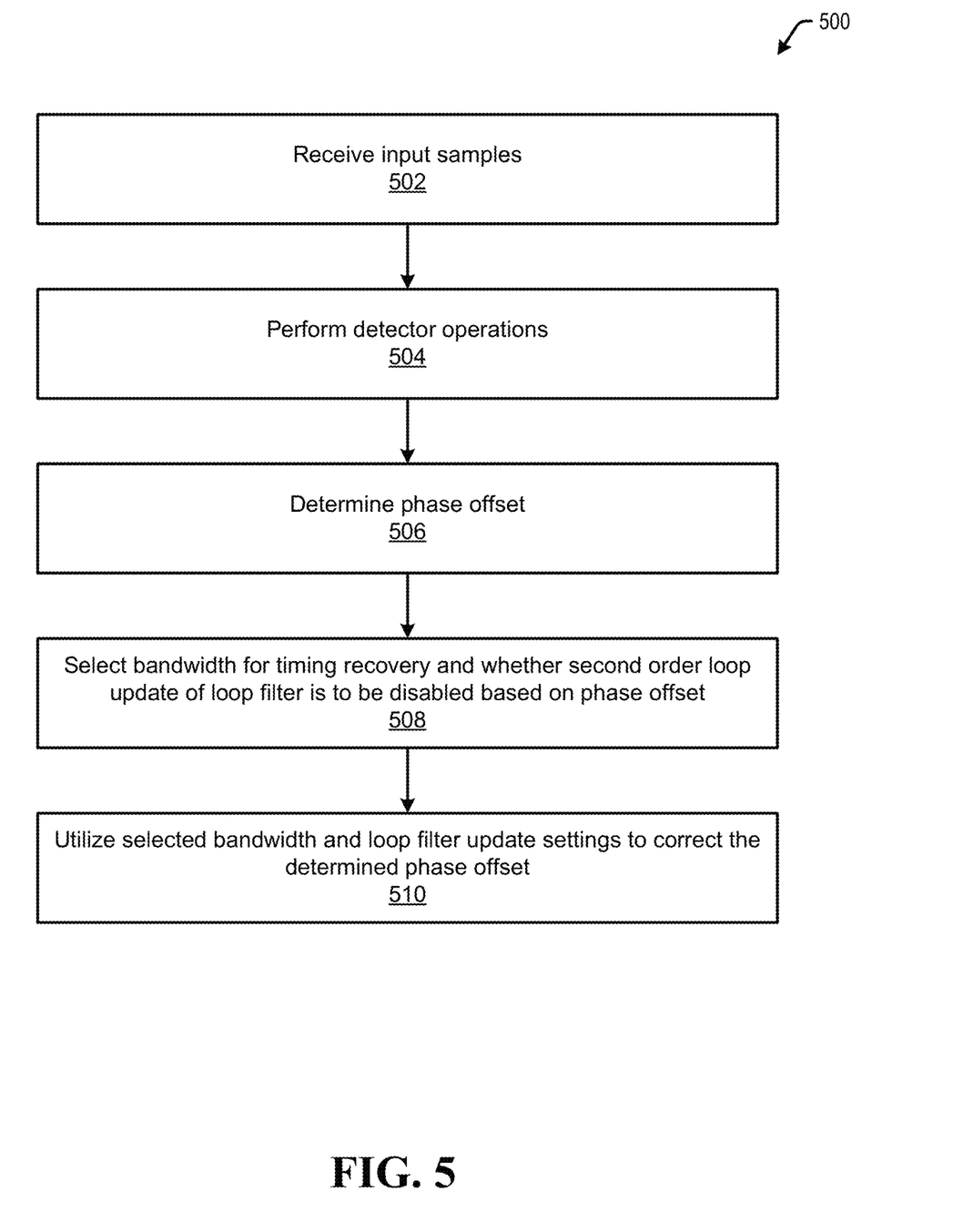
FIG. 5 is a flowchart of a method of timing recovery including selecting a timing recovery bandwidth based on a phase offset, in accordance with certain embodiments of the present disclosure.

Referring to FIG. 5, a flowchart of a method of timing recovery including selecting a timing recovery bandwidth based on a phase offset is shown and is generally designated 500. More particularly, flowchart 500 may be a flow of operations of the decision directed timing recovery circuits 116 and 300 as detailed above with respect to FIGS. 1-4.

In operation, the system may receive input samples at 502. At 504, the system may perform detector operations to generate detector decisions. At 506, the system may determine a phase offset based on the input samples and detector decisions. The system may then select a bandwidth for timing recovery and whether second order loop update of the loop filter is to be disabled based on determined phase offset at 508. Finally, at 510, the system may utilize the selected bandwidth and loop filter update settings to correct the determined phase offset.

All steps listed for the method 500 may be applied to various channel systems. Many variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 6:
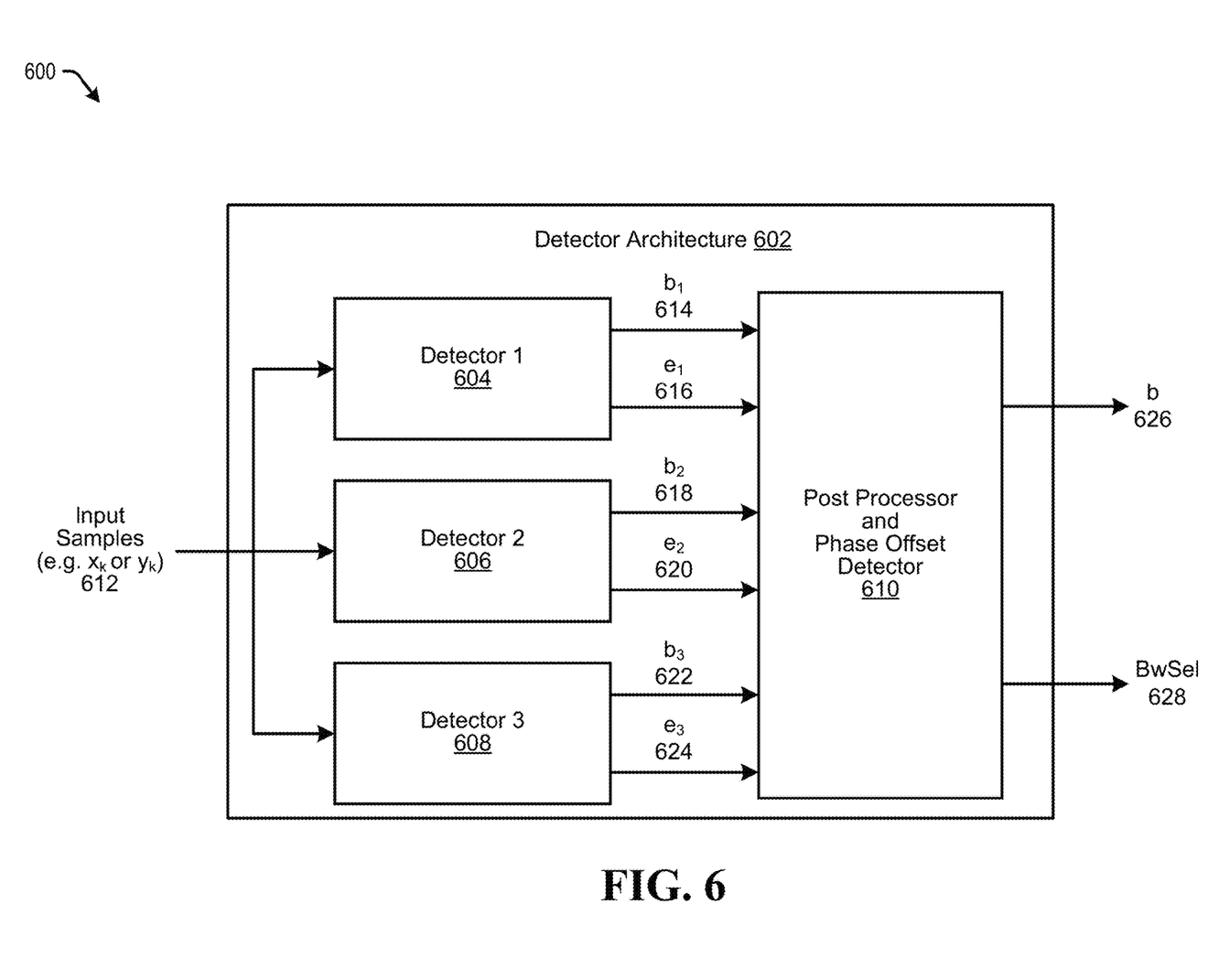
FIG. 6 illustrates a block diagram of an example detector architecture of a decision directed timing recovery circuit which may include a phase offset detection functionality for timing recovery, in accordance with certain embodiments of the present disclosure.

Referring to FIG. 6, a block diagram of an example detector architecture of a decision directed timing recovery circuit which may include a phase offset detection functionality for timing recovery is shown and is generally designated 600. More particularly, detector architecture 600 may be considered to perform the functionality of a combination of detector 302 and phase offset detector 304. Detector architecture 600 may include detector 1 604, detector 2 606, and detector 3 608, which may each be coupled to a post processor and phase offset detector circuit 610. In some embodiments, the detector architecture 600 may determine if the input samples 612 have an offset in sampling phase from a desired (or correct) value, generate detector decisions b 626 and specify the appropriate timing recovery bandwidth to utilize as BwSel 628. In general, the detection of phase offsets for use in the disclosed system may be latency sensitive, such as in the case of approaches which attempt to obviate cycle slips. To address latency concerns, the detector architecture 600 incorporates the phase offset detector into the operation of the detector.

Each of detector 1 604, detector 2 606, detector 3 608, and post processor and phase offset detector circuit 610 may be a separate circuit, a system on chip (SOC), firmware, a processor(s), or other system not listed, or any combination thereof.

In operation, detector 1 604, detector 2 606, and detector 3 608 may each receive the input samples (e.g. $x_k$ or $y_k$) 612. Each of the detectors 604-608 may operate at different sampling phase. Here, detector 1 604 may operate at the expected sampling phase for the system and detector 2 606 and detector 3 608 may each operate at a respective phase away from the expected sampling phase. In some embodiments, detector 2 606 may operate at a negative value (−X % T) with respect to the expected sampling phase while detector 3 608 may operate at the corresponding positive value (X % T) with respect to the expected sampling phase. The value X may be selected as a value sufficiently far enough from the expected sampling phase to allow for determining the presence of phase offsets. However, the sampling phases of detectors 606 and 608 need not be symmetrical with respect to the expected sampling phase.

As shown, each detector may generate a decision stream ($b_1$ 614, $b_2$ 618, and $b_3$ 622) and an associated error stream ($e_1$ 616, $e_2$ 620, and $e_3$ 624), where the error streams may provide an indication of the reliability of the detectors' own decisions. Each detector may and include some memory (e.g. the detectors each may on the current decision and some number of previous decisions). The post processor and phase offset detector 610 may operate to determine and output a detector decision b 626 and a bandwidth select setting BwSel 628 based on the outputs of detectors 604-608. The bit-error rates of a detector may be minimized when the phase offset is close to that detector's phase. The notable exception to this may occur as the phase offset magnitude approaches 50% T. As the phase offset nears 50% T in magnitude, the two auxiliary detectors (e.g. detectors 606 and 608) may produce decisions of almost equivalent reliability, but separated by 1T, and the equivalence may make the correct detector difficult to distinguish.

The post processor and phase offset detector 610 may monitor the generated errors to discern the presence of phase offsets. As mentioned above, the region of interest occurs when the detector 1 error ($e_0$ 616) is large and the disparity of the auxiliary detector errors ($e_2$ 620 and $e_3$ 624) becomes small. In some embodiments, thresholds ($t_1$ and $t_{2,3}$) may be placed on the magnitude of $e_0$ (e.g. $|e_0|$) and the magnitude of the disparity of $e_1$ and $e_2$ (e.g. $|e_1-e_2|$), respectively. When $e_1 > t_1$ and $|e_e - e_3| < t_{2,3}$, the bandwidth may be modulated. In other embodiments, to obviate the need for multiple thresholds, the threshold on the magnitude of the disparity of $e_2$ and $e_3$ ($|e_2-e_3|$) may be employed when $e_1$ is larger than one or both of these auxiliary errors. In other embodiments, the magnitude of the auxiliary detector error disparity may be used to determine the utilized bandwidth or BwSel 628 (e.g. the magnitude of the phase offset may be determined as a function of the inverse of the disparity in the auxiliary detector errors and the utilized bandwidth or BwSel 628 may be selected according to this value). Because the phase offset detection may be built into the detector architecture 602, the incurred latency may be minimized.

Figure 7:
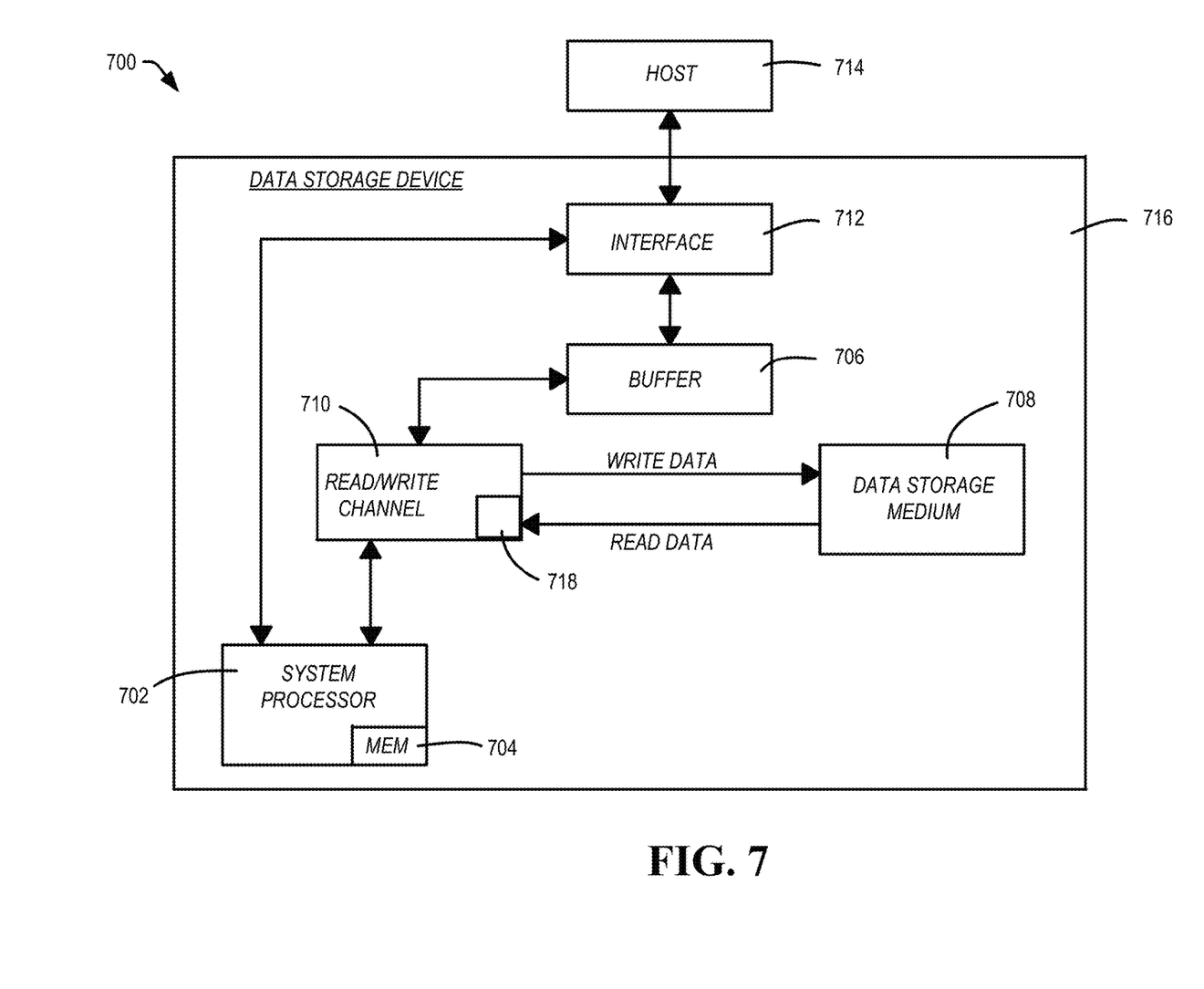
FIG. 7 is a block diagram of a system including functionality for timing recovery from phase offsets, in accordance with certain embodiments of the present disclosure.

Referring to FIG. 7, a block diagram of a system including functionality for timing recovery from phase offsets is shown and generally designated 700. The system 700 can be an example of a data storage device (DSD), and may be an example implementation of system 100. The DSD 716 can optionally connect to and be removable from a host device 714, which can be a device or system having stored data, such as a desktop computer, a laptop computer, a server, a digital video recorder, a photocopier, a telephone, a music player, other electronic devices or systems not listed, or any combination thereof. The data storage device 716 can communicate with the host device 714 via the hardware/firmware based host interface circuit 712 that may include a connector (not shown) that allows the DSD 716 to be physically connected and disconnected from the host 714.

The DSD 716 can include a system processor 702, which may be a programmable controller, and associated memory 704. The system processor 702 may be part of a system on chip (SOC). A buffer 706 may temporarily store data during read and write operations and can include a command queue. The read/write (R/W) channel 710 can encode data during write operations to, and reconstruct data during read operations from, the data storage medium 708. The data storage medium 708 is shown and described as a hard disc drive, but may be other types of magnetic medium, such as a flash medium, optical medium, or other medium, or any combination thereof.

The R/W channel 710 may receive data from more than one data storage medium at a time, and in some embodiments can also receive multiple data signals concurrently, such as from more than one output of a reader. Multi-sensor magnetic recording (MSMR) systems can receive two or more inputs from multiple sources (e.g. recording heads, flash memory, optical memory, and so forth) associated with the same magnetic medium. The R/W channel 710 can combine multiple inputs and provide a single output, as described in examples herein.

The block 718 can implement all of or part of the systems and functionality of systems and methods 100-600. In some embodiments, the block 718 may be a separate circuit, integrated into the R/W channel 710, included in a system on chip, firmware, software, or any combination thereof.

While the discussion herein centers around read channels as examples, the disclosed techniques and systems may apply to other circuits. Many variations would be apparent to one of ordinary skill in the art in view of this disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a sampling circuit configured to produce a sequence of input samples based on a continuous time input signal and a sample clock signal, a sampling phase of the sequence of input samples based on a phase control value output by a timing recovery circuit; and
   the timing recovery circuit configured to:
      receive the sequence of input samples;
      for a current sample of the sequence of input samples, detect a phase offset in the sampling phase of the sequence of input samples, the phase offset being a deviation of the sampling phase from an expected phase;
      in response to detecting the phase offset, select a bandwidth for timing recovery;
      generate an updated phase control value based on the bandwidth for timing recovery;
      determine a magnitude of the phase offset;
      select the bandwidth based on the magnitude of the phase offset;
      select the bandwidth from a plurality of bandwidth settings;
      select a first bandwidth setting of the plurality of bandwidth settings for a first range of phase offset magnitudes; and
      select a second bandwidth setting of the plurality of bandwidth settings for a second range of phase offset magnitudes, the second range of phase offset magnitudes including phase offsets with greater magnitudes than the first range of phase offset magnitudes.

2. The apparatus of claim 1, comprising the timing recovery circuit further configured to:

select a third bandwidth setting of the plurality of bandwidth settings for a third range of phase offset magnitudes, the third range of phase offset magnitudes including phase offsets with greater magnitudes than the second range of phase offset magnitudes, the third bandwidth setting including a reduced bandwidth for timing recovery with respect to another bandwidth for timing recovery associated with the first bandwidth setting.

3. The apparatus of claim 2, comprising the second bandwidth setting includes an increased bandwidth for timing recovery with respect to the first bandwidth setting.

4. The apparatus of claim 2, comprising the first range of phase offset magnitudes includes phase offset magnitudes suitable for normal operation.

5. The apparatus of claim 1, comprising the timing recovery circuit further configured to disable, with respect to the second bandwidth setting, second order loop updates of a second order loop filter.

6. The apparatus of claim 1, comprising the timing recovery circuit includes a detector circuit configured to perform detection operations on the sequence of input samples to generate detector decisions, the timing recovery circuit further configured to utilize the detector decisions to determine the expected phase and the phase offset for the current sample of the sequence of input samples.

7. A system comprising:
a timing recovery circuit including:
an input configured to receive a sequence of input samples, a sampling phase of the sequence of input samples based on a phase control value output by the timing recovery circuit;
a phase offset detector circuit configured to:
detect, for a current sample of the sequence of input samples, a phase offset in the sampling phase of the sequence of input samples, the phase offset being a deviation of the sampling phase from an expected phase;
in response to detecting the phase offset, select a bandwidth for timing recovery;
a loop filter configured to generate an update value for the phase control value based on the bandwidth for timing recovery; and
an update circuit configured to generate an updated phase control value based on the phase control value and the update value.

8. The system of claim 7 further comprising:
a sampling circuit configured to produce the sequence of input samples based on a continuous time input signal associated with a reader that is configured to read from a surface of a magnetic data storage medium, a sample clock signal and the phase control value output by the timing recovery circuit.

9. The system of claim 7 comprising the phase offset detector circuit further configured to:
determine a magnitude of the phase offset; and
determine the bandwidth based on the magnitude of the phase offset.

10. The system of claim 9 comprising the phase offset detector circuit further configured to:
select the bandwidth from a plurality of bandwidth settings;
select a first bandwidth setting of the plurality of bandwidth settings for a first range of phase offset magnitudes including phase offset magnitudes suitable for normal operation; and select a second bandwidth setting of the plurality of bandwidth settings for a second range of phase offset magnitudes, the second range of phase offset magnitudes including phase offsets with greater magnitudes than the first range of phase offset magnitudes, the second bandwidth setting including an increased bandwidth for timing recovery with respect to a bandwidth for timing recovery associated with the first bandwidth setting.

11. The system of claim 10 comprising the phase offset detector circuit further configured to select a third bandwidth setting of the plurality of bandwidth settings for a third range of phase offset magnitudes, the third range of phase offset magnitudes including phase offsets with greater magnitudes than the second range of phase offset magnitudes, the third bandwidth setting including a reduced bandwidth for timing recovery with respect to another bandwidth for timing recovery associated with the first bandwidth setting.

12. The system of claim 10 comprising the phase offset detector circuit further configured to disable second order loop updates of a second order loop filter based on the phase offset.

13. A method comprising:
producing, by a sampling circuit, a sequence of input samples based on a continuous time input signal and a sample clock signal, a sampling phase of the sequence of input samples based on a phase control value output by a timing recovery circuit;
receiving, by the timing recovery circuit, the sequence of input samples;
detecting, by a phase offset detector circuit of the timing recovery circuit, for a current sample of the sequence of input samples, a phase offset in the sampling phase of the sequence of input samples, the phase offset being a deviation of the sampling phase from an expected phase;
in response to detecting the phase offset, selecting, by the phase offset detector circuit, a bandwidth for timing recovery;
generating, by a loop filter of the timing recovery circuit, an update value for the phase control value based on the bandwidth for timing recovery; and
generating, by an update circuit of the timing recovery circuit, an updated phase control value based on the phase control value and the update value.

14. The method of claim 13 further comprising:
determining, by the phase offset detector circuit, a magnitude of the phase offset; and
selecting, by the phase offset detector circuit, the bandwidth based on the magnitude of the phase offset.

15. The method of claim 14 further comprising:
selecting the bandwidth from a plurality of bandwidth settings;
selecting a first bandwidth setting of the plurality of bandwidth settings for a first range of phase offset magnitudes including phase offset magnitudes suitable for normal operation;
selecting a second bandwidth setting of the plurality of bandwidth settings for a second range of phase offset magnitudes, the second range of phase offset magnitudes including phase offsets with greater magnitudes than the first range of phase offset magnitudes, the second bandwidth setting including an increased bandwidth for timing recovery with respect to a bandwidth for timing recovery associated with the first bandwidth setting; and selecting a third bandwidth setting of the plurality of bandwidth settings for a third range of phase offset magnitudes, the third range of phase offset magnitudes including phase offsets with greater magnitudes than the second range of phase offset magnitudes, the third bandwidth setting including a reduced bandwidth for timing recovery with respect to another bandwidth for timing recovery associated with the first bandwidth setting.

16. The method of claim 14 further comprising:

selecting the bandwidth from a plurality of bandwidth settings;

selecting a first bandwidth setting of the plurality of bandwidth settings for a first range of phase offset magnitudes including phase offset magnitudes suitable for normal operation; and selecting a second bandwidth setting of the plurality of bandwidth settings for a second range of phase offset magnitudes, the second range of phase offset magnitudes including phase offsets with greater magnitudes than the first range of phase offset magnitudes, the second bandwidth setting including a reduced bandwidth for timing recovery with respect to a bandwidth for timing recovery associated with the first bandwidth setting.

\* \* \* \* \*